United States Patent
Busletta et al.

(10) Patent No.: US 6,353,379 B1
(45) Date of Patent: Mar. 5, 2002

(54) MAGNETIC DEVICE EMPLOYING A WINDING STRUCTURE SPANNING MULTIPLE BOARDS AND METHOD OF MANUFACTURE THEREOF

(75) Inventors: Galliano R. Busletta, Mesquite; Robert J. Roessler, Rowlett; Matthew A. Wilkowski, Mesquite; William L. Woods, Jr., Kaufman, all of TX (US)

(73) Assignee: Lucent Technologies Inc., Murray Hill, NJ (US)

( * ) Notice: Subject to any disclaimer, the term of this patent is extended or adjusted under 35 U.S.C. 154(b) by 0 days.

(21) Appl. No.: 09/514,822

(22) Filed: Feb. 28, 2000

(51) Int. Cl.[7] .................................................. H01F 5/00
(52) U.S. Cl. ........................ 336/200; 336/232; 336/223; 29/602.1
(58) Field of Search ................................ 336/200, 223, 336/232; 29/602.1, 606

(56) References Cited

U.S. PATENT DOCUMENTS

| | | |
|---|---|---|
| 4,622,627 A | 11/1986 | Rodriguez et al. |
| 5,345,670 A | 9/1994 | Pitzele et al. |
| 5,990,776 A | 11/1999 | Jitaru |
| 6,147,583 A * | 11/2000 | Rinne et al. ............ 336/200 |
| 6,239,683 B1 | 5/2001 | Roessler et al. |
| 6,262,649 B1 | 7/2001 | Roessler et al. |
| 6,281,779 B1 * | 8/2001 | Matsumoto et al. ...... 336/200 |

OTHER PUBLICATIONS

U.S. application No. 08/940,557, Pitzele et al., filed May 4, 1995, entitled "Power Magnetic Device Employing Leadless Connection to a Printed Circuit Board And Method of Manufacture Thereof".

U.S. application No. 08/940,672, Pitzele et al., filed May 4, 1995, entitled "Post–mountable Planar Magnetic Device And Method of Manufacture Thereof".

\* cited by examiner

*Primary Examiner*—Anh Mai

(57) ABSTRACT

A magnetic device and a method of manufacturing the same. In one embodiment, the device includes: (1) a magnetic core and (2) a winding structure located proximate the magnetic core. The winding structure includes:(2a) a multilayer main circuit board containing an interconnected first plurality of winding layers, (2b) a multilayer overlay board located proximate the main circuit board and containing an interconnected second plurality of winding layers and (2c) conductors coupling the first and second pluralities of winding layers together to cause the first and second pluralities of winding layers to function cooperatively as windings for the magnetic device.

14 Claims, 3 Drawing Sheets

MAGNETIC DEVICE EMPLOYING A WINDING STRUCTURE SPANNING MULTIPLE BOARDS AND METHOD OF MANUFACTURE THEREOF

TECHNICAL FIELD OF THE INVENTION

The present invention is directed, in general, to magnetic devices and, more specifically, to a magnetic device employing a winding structure spanning multiple boards and method of manufacture thereof

BACKGROUND OF THE INVENTION

Magnetic devices, such as inductors and transformers, are employed in many different types of electrical circuits, such as power supply circuits. In practice, most power magnetic devices are fabricated of one or more windings formed by an electrical member. The electrical member may be a wire of circular or rectangular cross section or a planar conductor wound about or mounted to a bobbin composed of dielectric material, such as plastic. In some instances, the electrical member is soldered to terminations on the bobbin. Alternatively, the electrical member may be threaded through the bobbin for connection directly to a metallized area on a circuit board. A magnetic core is affixed about the bobbin to impart a greater reactance to the power magnetic device.

As with other types of electronic components, there is a trend in the design of power magnetic devices toward achieving increased power and volumetric density and lower device profile. To achieve higher power, the resistance of the power magnetic device must be reduced, typically by increasing the cross-sectional area of the electrical member forming the device windings, or by simply reducing the electrical path length of the device. To increase the density of the power magnetic device, the bobbin is usually made relatively thin in the region constituting the core of the device to optimize the electrical member resistance. Conversely, the remainder of the bobbin is usually made relatively thick to facilitate attachment of the electrical member to the bobbin terminals or to facilitate attachment of terminals on the bobbin to a circuit board. As a result of the need to make such a bobbin thin in some regions and thick in others, the bobbin is often subject to stresses at transition points between such thick and thin regions.

Another problem associated with present-day power magnetic devices is the lack of co-planarity of the device terminations. Because of the need to optimize the winding thickness of the power magnetic device to provide the requisite number of turns while minimizing the winding resistance, the thickness of the electrical member forming each separate winding of the device is often varied. Variation in the winding thickness often results in a lack of co-planarity of the device terminations, an especially critical deficiency when the device is to be mounted onto a surface of a substrate, such as a printed wiring board (PWB).

Power magnetic devices, suitable for attachment to a substrate such as a PWB, may include at least one sheet winding having a pair of spaced-apart terminations. The sheet winding terminations and lead portions, together with at least a portion of the sheet windings, may be surrounded by a molding material. A magnetic core may surround at least a portion of the plurality of individually insulated sheet windings to impart a desired magnetic property to the device. Thus, a bobbin-free, surface-mountable power magnetic device that overcomes some of the deficiencies discussed above therefore represents an advance over the previously-described power magnetic devices (See for instance, U.S. Pat. No. 5,345,670, entitled "Method of Making a Surface Mount Power Magnetic Device," issued on Sep. 13, 1994, to Pitzele, et al. which is incorporated herein by reference).

In certain of these approaches, the sheet windings form a portion of a PWB that attaches to another PWB. The device leads often extend substantially from the device footprint and therefore increase the area of the substrate required to mount the device. In fact, extended leads can add 30% to the footprint or 50% to the volume of the magnetic device. Also, termination co-planarity may require that either the aforementioned devices be molded in a lead frame (requiring additional tooling and tighter tolerances) or that the leads be staked in after molding (requiring an additional manufacturing operation). Additionally, the separate PWB and outer molding compound, if employed for electrical isolation and thermal conductivity, adds both volume and cost and raises the device profile.

Alternately, the sheet windings may be part of a multilayer circuit such as an FR-4 board (manufactured by Key Grant, of Fountain Vally, Calif.) thereby eliminating the separate PWB altogether (See, for instance, , U.S. patent application Ser. No. 08/940,557, entitled "Power Magnetic Device Employing Leadless Connection to a Printed Circuit Board And Method of Manufacture Thereof," filed May 4, 1995, to Pitzele, et al., and U.S. patent application Ser. No. 08/940,672, entitled "Post-mountable Planar Magnetic Device And Method of Manufacture Thereof," filed May 4, 1995, to Pitzele, et al., which are incorporated herein by reference). There are instances, however, where employing a separate multilayer circuit to accommodate the windings is not the design of choice.

In either case, the separate PWB or multilayer circuit must have enough layers to accommodate the total number of windings needed. A transformer typically consists of a minimum of one primary winding and one secondary winding. This results in a minimum of a two layer board, given a transformer turns ratio of 1:1. Multiple outputs and other turns ratios may easily result in a transformer requiring as many as 16 layers. Current circuit PWBs typically accommodate only four layers economically, but may include eight layers (or more) at over twice the cost of four layers. If a PWB requires two to four layers to accommodate the other electronic components, adding additional layers to accommodate the need for more sheet windings in a magnetic device becomes cost prohibitive and reliability of the circuit may become an issue. This also makes the circuit board unique to only one transformer ratio.

Accordingly, what is needed in the art is an improved way to accommodate the need for additional sheet winding layers that overcomes the deficiencies in the prior art.

SUMMARY OF THE INVENTION

To address the above-discussed deficiencies of the prior art, the present invention provides a magnetic device and a method of manufacturing the same. In one embodiment, the device includes: (1) a magnetic core and (2) a winding structure located proximate the magnetic core. The winding structure includes:(2a) a multilayer main circuit board containing an interconnected first plurality of winding layers, (2b) a multilayer overlay board located proximate the main circuit board and containing an interconnected second plurality of winding layers and (2c) conductors coupling the first and second pluralities of winding layers together to cause the first and second pluralities of winding layers to function cooperatively as windings for the magnetic device.

The present invention, in one aspect, introduces the broad concept of judiciously distributing the winding structure associated with a magnetic device to allow a more advantageous packaging or utility of the magnetic device. Those skilled in the pertinent art will understand that the term "magnetic device" includes both transformers and inductors. The present invention encompasses not only these devices, but all forms thereof and any later-developed magnetic devices so structured.

In one embodiment of the present invention, the magnetic core includes a first portion coupled to the main circuit board and a second portion coupled to the overlay board. Of course, the magnetic core may be one piece. Any appropriate magnetic material may be used for the magnetic core, and it may be constructed in a variety of appropriate forms, including an E-core structure or other types having a gap or being gapless.

In one embodiment of the present invention, the magnetic core is surface-mounted to the main circuit board and the overlay board. The magnetic core may be glued to either the main circuit board or the overlay board or it may be glued to each as the application may dictate. Additionally, a through-hole mounting structure may also be used with either or both of the main circuit and overlay boards.

In one embodiment of the present invention, the overlay board is oriented parallel to the main circuit board. In an alternate embodiment, the overlay board may be perpendicular or offset to the main circuit board. Of course, other orientations are possible and well within the broad scope of the present invention.

In one embodiment of the present invention, the overlay board is affixed directly to the main circuit board. Alternately, an intervening structure or gap may be used. Additionally, the overlay board and the main circuit board may each consist of four layers. Of course, other numbers of layers are possible and well within the broad scope of the present invention.

In one embodiment of the present invention, the conductors are selected from the group consisting of: (1) corresponding conductive vias located in each of the overlay board and the main circuit board, (2) at least one conductive post located on one of the overlay board and the main circuit board and (3) a connector coupled to an edge of the overlay board. Those skilled in the art will readily perceive that other conventional or later-discovered structures for interconnecting boards or devices fall within the broad scope of the present invention.

The foregoing has outlined, rather broadly, preferred and alternative features of the present invention so that those skilled in the art may better understand the detailed description of the invention that follows. Additional features of the invention will be described hereinafter that form the subject of the claims of the invention. Those skilled in the art should appreciate that they can readily use the disclosed conception and specific embodiment as a basis for designing or modifying other structures for carrying out the same purposes of the present invention. Those skilled in the art should also realize that such equivalent constructions do not depart from the spirit and scope of the invention in its broadest form.

BRIEF DESCRIPTION OF THE DRAWINGS

For a more complete understanding of the present invention, reference is now made to the following descriptions taken in conjunction with the accompanying drawings, in which.

DETAILED DESCRIPTION

Figure 1A:
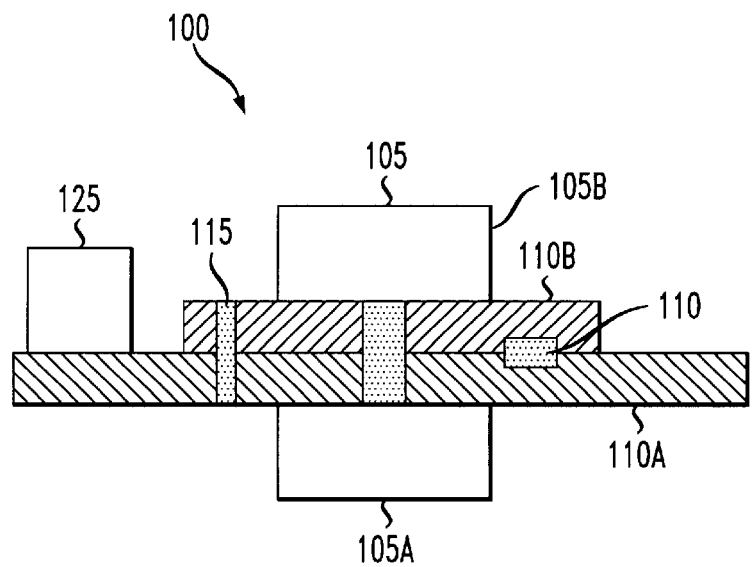
FIG. 1A illustrates a block diagram of an embodiment of a magnetic device employing constructed according to the principles of the present invention.

Referring initially to FIG. 1A, illustrated is block diagram of an embodiment of a magnetic device 100 constructed according to the principles of the present invention. The magnetic device 100 includes a magnetic core 105 and a winding structure 110 located proximate the magnetic core 105. The magnetic core 105 includes a first portion 105A and a second portion 105B. The winding structure 110 is part of a multilayer main circuit board 110A and a multilayer overlay board 110B (located proximate the main circuit board 110A). A plurality of conductors couple the first and second pluralities of winding layers together (see FIG. 1B).

The first portion 105A, of the magnetic core 105, is coupled to the main circuit board 110A, and the second portion 105B is coupled to the overlay board 110B. The magnetic core 105 may also be one piece, in other embodiments. Any appropriate magnetic material may be used for the magnetic core 105, and it may be constructed in a variety of appropriate forms. These forms may include an E-core structure, or alternately, other types of forms having a gap or being gapless.

The main circuit board 110A contains an interconnected first plurality of winding layers, and the overlay board 110B contains an interconnected second plurality of winding layers. The plurality of conductors couple the first and second pluralities of winding layers together to cause the first and second pluralities of winding layers to function cooperatively as windings for the magnetic device 100.

Thus, the present invention accommodates the judicious distribution of the winding structure 110 associated with the magnetic device 100 to allow a more advantageous packaging or utility of the magnetic device 100. Recall that a magnetic device may include both transformers and inductors. Additionally, the present invention encompasses not only these devices, but all forms of current or later-developed magnetic devices so structured.

In the present embodiment, the magnetic core 105 is surface-mounted to the main circuit board 110A and the overlay board 110B. The magnetic core 105 may be glued to either the main circuit board 110A, the overlay board 110B or it may be glued to each as the application may dictate. Additionally, a through-hole mounting structure may also be used with either or both of the main circuit and overlay boards 110A, 110B. Additionally, other electronic components (one which is designated 125) may be coupled to the main circuit board 110A to complete a circuit such as a power supply (see FIG. 3).

In the embodiment of FIG. 1A, the overlay board 110B is oriented parallel to the main circuit board 110A. In an alternate embodiment, the overlay board 110B may be perpendicular or offset to the main circuit board 110A. Of course, other orientations are possible and well within the broad scope of the present invention.

Additionally, the overlay board 110B is affixed directly to the main circuit board 110A. Alternately, an intervening structure or gap may be used between the two boards. While the overlay board 110B and the main circuit board 110A each include four layers, any number of layers are possible and well within the broad scope of the present invention. Additionally, multiple boards may be used above and below the main circuit board 110A in an alternate embodiment of the present invention. Also, individually insulated rings formed from a conductive material, such as copper, may be employed in place of or in addition to the main circuit board 110A or the overlay board 110B to form a part of the winding structure 110. For example, a number of rings may be mounted proximate the main circuit board 110A in place of the overlay board 110B. Alternatively, the rings may be employed to increase the number of turns available from the winding structure 110 when more windings are required than are available due to the limited number of layers of the main circuit board 110A and the overlay board 110B.

Figure 1B:
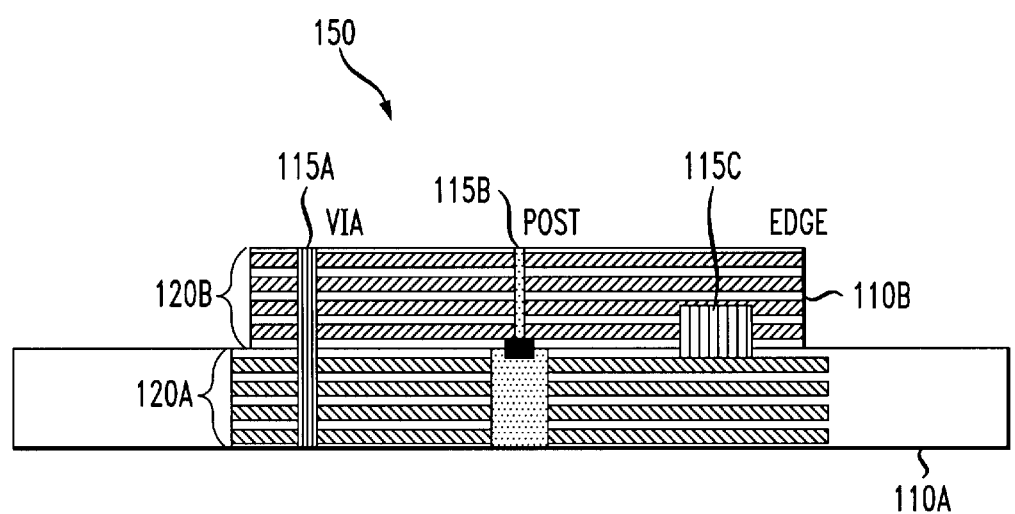
FIG. 1B illustrates a block diagram of the winding structure for the magnetic device of FIG. 1.

Turning now to FIG. 1B, illustrated a block diagram of the winding structure 110 for the magnetic device 100 of FIG. 1. The main circuit board 110A contains the interconnected first plurality of winding layers (collectively designated 120A) with individually insulated winding layers. The overlay board 110B contains the interconnected second plurality of winding layers (collectively designated 120B) with individually insulated winding layers. The plurality of conductors couple the first and second pluralities of winding layers 120A, 120B together. The plurality of conductors include a conductive via 115A located in each of the overlay board 110B and the main circuit board 110A, and a conductive post 115B located on the main circuit board 110A that connects to the overlay board 110B. The plurality of conductors further include a connector 115C coupled to an edge of the overlay board 110B from the main circuit board 110A. Those skilled in the art will readily perceive that other conventional or later-discovered structures for interconnecting boards or devices (including mechanically and electrically) fall within the broad scope of the present invention.

Figure 2:
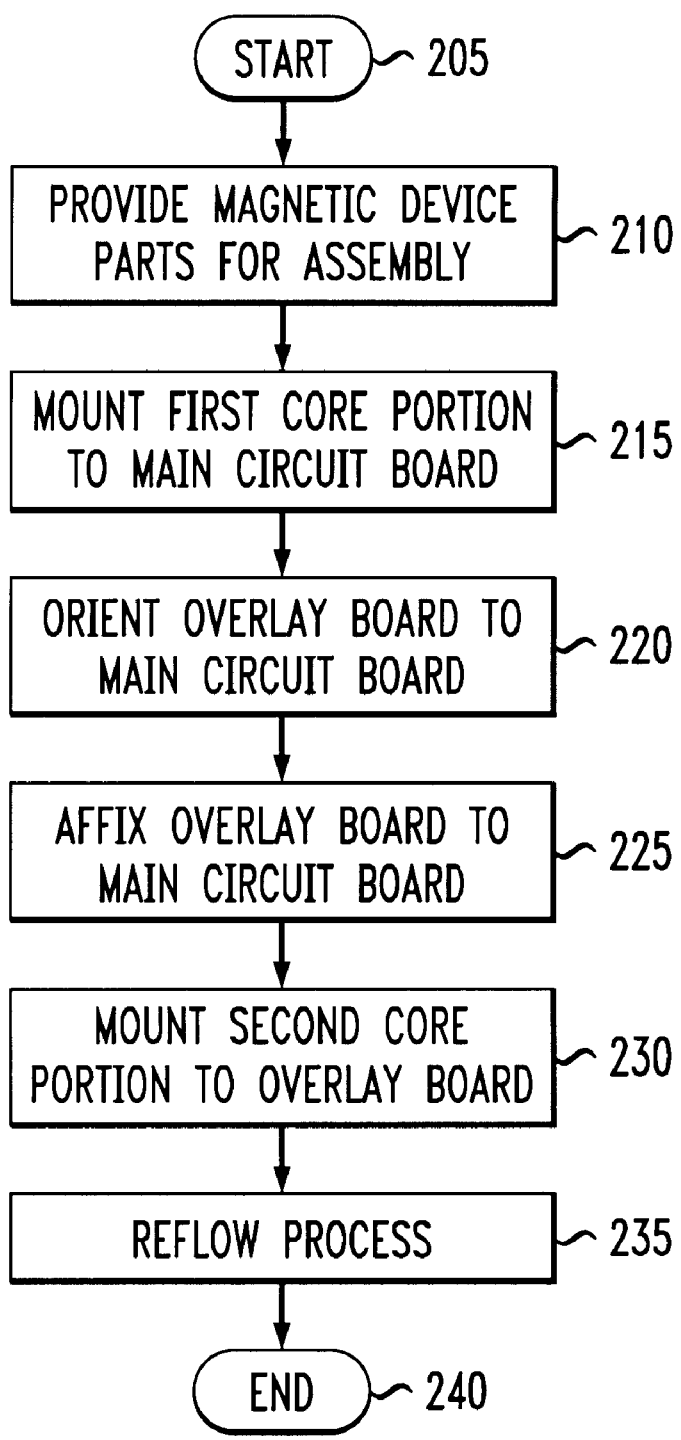
FIG. 2 illustrates a flow diagram of an embodiment of a method of manufacturing a magnetic device in accordance with the principles of the present invention.

Turning now to FIG. 2, illustrated is a flow diagram of an embodiment of a method of manufacturing a magnetic device in accordance with the principles of the present invention. The method begins at a start step 205 with the decision to construct the magnetic device. Next, in a collection step 210, the parts to assemble the magnetic device are collected. The collection step 210 includes providing a magnetic core wherein the magnetic core has a first portion couplable to a multilayer main circuit board, and a second portion couplable to an overlay board. A winding structure is formed in a multilayer main circuit board (containing an interconnected first plurality of winding layers) and an overlay board (containing an interconnected second plurality of winding layers). The overlay board and the main circuit board each consist of four layers.

The winding structure further includes conductors that couple the first and second pluralities of winding layers together to cause the first and second pluralities of winding layers to function cooperatively as windings for the magnetic device. The conductors may be conductive vias located in each of the overlay board and the main circuit board.

In a step 215, a first portion of the magnetic core is surface mounted to the main circuit board using an adhesive and cured to set the adhesive. The first portion of the magnetic core is mounted to the side of the main circuit board that is opposite from the overlay board. Additionally, other components may be mounted on the same side of the main circuit board as the first portion of the magnetic core. In a step 220, the overlay board is oriented and positioned with respect to the main circuit board, and in a step 225, the overlay board is affixed directly to the main circuit board preferably using at least one of the connectors previously discussed thereby aligning the first and second portions of the magnetic core. A solder paste can also be applied to the overlay or main circuit boards prior to affixing the over lay board to the main circuit board.

In a step 230, a second portion of the magnetic core is mounted to the overlay board using an adhesive and cured to set the adhesive. The second portion of the magnetic core is mounted (via glue) to the overlay board on the side of the overlay board that is opposite from the side to be connected to the main circuit board. A reflow solder process is then performed in a reflow step 235 and the method ends at and end step 240 with a completed assembly.

Figure 3:
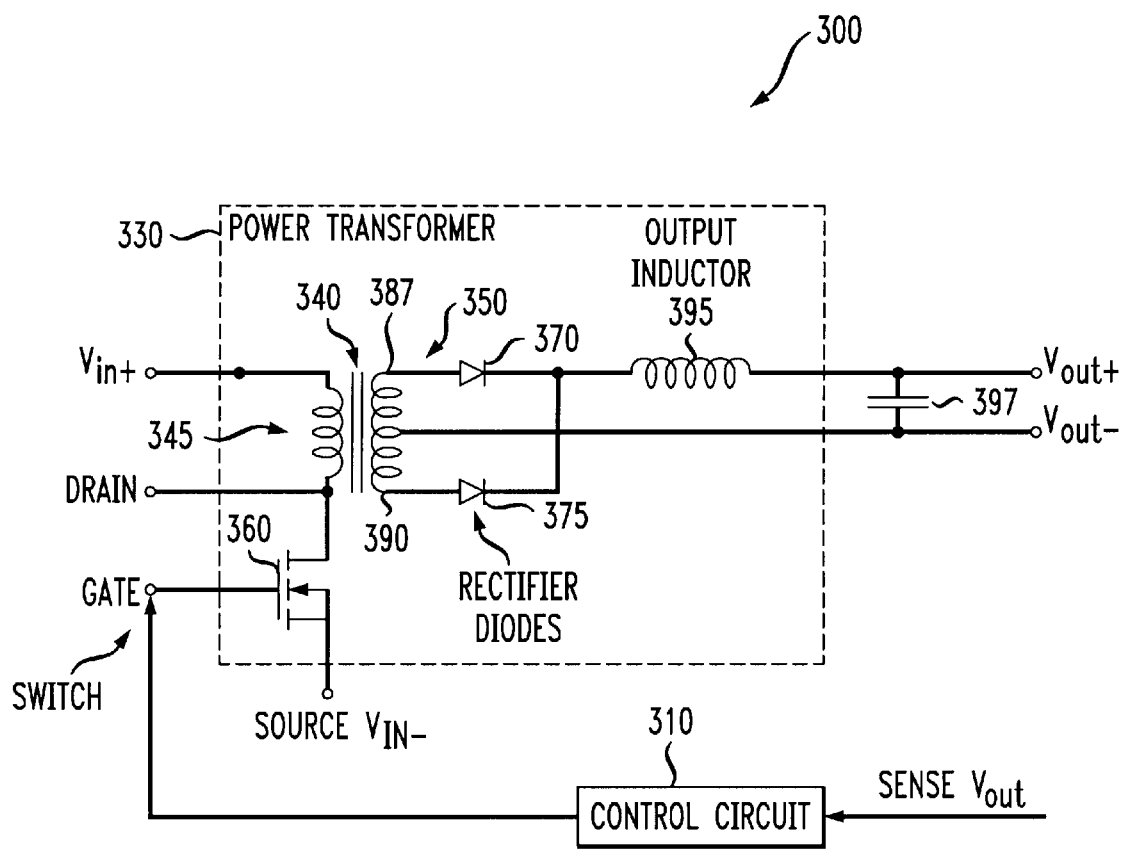
FIG. 3 illustrates a schematic diagram of a power converter constructed according to the principles of present invention.

Turning now to FIG. 3, illustrated is a schematic diagram of a power converter 300 constructed according to the principles of present invention. The power converter 300 contains control circuitry 310 for applying control signals to a power train 330. The power train 330 has an input coupled to a source of electrical power for receiving an input voltage Vin and an output coupled to an electrical load (not shown). The power converter 300 further contains a filter capacitor 397 for filtering an output voltage Vout.

The power train 330 includes an isolation transformer 340 having a primary winding 345 and secondary winding 350. The power train 330 further includes a switch 360 coupled to the primary winding 345 of the isolation transformer 340. In the illustrated embodiment, the switch 360 is a field-effect transistor (FET). Of course, other switches (e.g., bipolar transistors) may also be used. The power train 330 further includes a rectifier (consisting of a pair of rectifying diodes 370, 375) coupled to the secondary winding 350 of the isolation transformer 340. Alternatively, other rectifying devices and circuits (e.g., active switches, such as FETs, in a synchronous rectifier) may be employed to advantage. The rectifying diodes 370, 375 rectify a periodic waveform supplied thereto by the secondary winding 350. The power train 330 still further includes an output inductor 395, coupled to the rectifier. The power train 330 employs the isolation transformer 340, rectifying diodes 370, 375, and output inductor 395 to convert AC electrical power into DC electrical power.

The isolation transformer 340 and the output inductor 395 may be constructed according to the principles of the present invention. The isolation transformer 340 and the output inductor 395 are separate magnetic devices that include a magnetic core and a winding structure located proximate the magnetic core as described in the FIGS. 1A AND 1B above.

Additionally, the power train 330 and other power supply circuitry may be surrounded by the encapsulant to form a power converter module. In this environment, the present invention provides an encapsulated power converter 300 that may be mounted to a circuit board as easily and conveniently as any other electronic circuitry.

Those skilled in the art should understand that the previously described embodiments of the magnetic device, power converter and related method are submitted for illustrative purposes only and other embodiments are well within the broad scope of the present invention. Additionally, exemplary embodiments of the present invention have been illustrated with reference to specific electronic components. Those skilled in the art are aware, however, that components may be substituted (not necessarily with components of the same type) to create desired conditions or accomplish desired results. For instance, multiple components may be substituted for a single component and vice-versa. The principles of the present invention may be applied to a wide variety of power circuit topologies.

For a better understanding of power electronics including power supplies and conversion technologies, see "Principles of Power Electronics," by J. G. Kassakian, M. F. Schlecht and G. C. Verghese, Addison-Wesley (1991). For a better understanding of magnetic devices and construction techniques therefor see "Handbook of Transformer Applications," by William Flanagan, McGraw Hill Book Co. (1986). The aforementioned references are incorporated herein by reference.

Although the present invention has been described in detail, those skilled in the art should understand that they can make various changes, substitutions and alterations herein without departing from the spirit and scope of the invention in its broadest form.

What is claimed is:

1. A magnetic device, comprising:
   a magnetic core; and
   a winding structure, located proximate said magnetic core and including:
      a multilayer main circuit board containing an interconnected first plurality of winding layers,
      a multilayer overlay board located proximate said main circuit board and containing an interconnected second plurality of winding layers, and
      conductors coupling said first and second pluralities of winding layers together to cause said first and second pluralities of winding layers to function cooperatively as windings for said magnetic device.

2. The device as recited in claim 1 wherein said magnetic core comprises:
   a first portion coupled to said main circuit board; and
   a second portion coupled to said overlay board.

3. The device as recited in claim 1 wherein said magnetic core is surface-mounted to said main circuit board and said overlay board.

4. The device as recited in claim 1 wherein said overlay board is oriented parallel to said main circuit board.

5. The device as recited in claim 1 wherein said overlay board is affixed directly to said main circuit board.

6. The device as recited in claim 1 wherein said overlay board and said main circuit board each consist of four layers.

7. The device as recited in claim 1 wherein said conductors are selected from the group consisting of:
   corresponding conductive vias located in each of said overlay board and said main circuit board,
   at least one conductive post located on one of said overlay board and said main circuit board, and
   a connector coupled to an edge of said overlay board.

8. A method of manufacturing a magnetic device, comprising:
   providing a magnetic core; and
   forming a winding structure proximate said magnetic core, said winding structure including:
      a multilayer main circuit board containing an interconnected first plurality of winding layers,
      a multilayer overlay board located proximate said main circuit board and containing an interconnected second plurality of winding layers, and
      conductors coupling said first and second pluralities of winding layers together to cause said first and second pluralities of winding layers to function cooperatively as windings for said magnetic device.

9. The method as recited in claim 8 wherein said magnetic core comprises:
   a first portion coupled to said main circuit board; and
   a second portion coupled to said overlay board.

10. The method as recited in claim 8 further comprising surface mounting said magnetic core to said main circuit board and said overlay board.

11. The method as recited in claim 8 further comprising orienting said overlay board parallel to said main circuit board.

12. The method as recited in claim 8 further comprising affixing said overlay board directly to said main circuit board.

13. The method as recited in claim 8 wherein said overlay board and said main circuit board each consist of four layers.

14. The method as recited in claim 8 wherein said conductors are selected from the group consisting of:
   corresponding conductive vias located in each of said overlay board and said main circuit board,
   at least one conductive post located on one of said overlay board and said main circuit board, and
   a connector coupled to an edge of said overlay board.

* * * * *